(12) United States Patent
Xiao

(10) Patent No.: US 10,347,619 B2
(45) Date of Patent: Jul. 9, 2019

(54) SEMICONDUCTOR DEVICE HAVING ELECTROSTATIC DISCHARGE PROTECTION STRUCTURE WITH A TRENCH UNDER A CONNECTING PORTION OF A DIODE

(71) Applicant: CSMC TECHNOLOGIES FAB2 CO., LTD., Wuxi New District (CN)

(72) Inventor: Kui Xiao, Wuxi New District (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 15/770,624

(22) PCT Filed: Aug. 19, 2016

(86) PCT No.: PCT/CN2016/096042
§ 371 (c)(1),
(2) Date: Apr. 24, 2018

(87) PCT Pub. No.: WO2017/071381
PCT Pub. Date: May 4, 2017

(65) Prior Publication Data
US 2019/0057960 A1    Feb. 21, 2019

(30) Foreign Application Priority Data
Oct. 28, 2015    (CN) .......................... 2015 1 0719263

(51) Int. Cl.
*H01L 27/02*    (2006.01)
*H01L 29/06*    (2006.01)
(Continued)

(52) U.S. Cl.
CPC ...... *H01L 27/0255* (2013.01); *H01L 29/0696* (2013.01); *H01L 29/7813* (2013.01); *H01L 29/866* (2013.01)

(58) Field of Classification Search
CPC ........................ H01L 27/0255; H01L 29/866
See application file for complete search history.

(56) References Cited

U.S. PATENT DOCUMENTS 5,572,061 A * 11/1996 Chen .................. H01L 23/5252
257/530
8,772,861 B2    7/2014 Zundel et al.
(Continued)

FOREIGN PATENT DOCUMENTS

CN          1524298 A        8/2004
CN        101692425 A        4/2010
(Continued)

OTHER PUBLICATIONS

Unpublished Utility U.S. Appl. No. 16/305,119, filed Nov. 28, 2018 (31 pages).
(Continued)

*Primary Examiner* — Quoc D Hoang
(74) *Attorney, Agent, or Firm* — Kagan Binder, PLLC

(57) ABSTRACT

Disclosed is a semiconductor device having an electrostatic discharge protection structure. The electrostatic discharge protection structure is a diode connected between a gate electrode and a source electrode of the semiconductor device. The diode comprises a diode body and two connection portions connected to two ends of the diode body and respectively used for electrically connecting to the gate electrode and the source electrode. Lower parts of the two connection portions are respectively provided with a trench. An insulation layer is provided on an inner surface of the trench and the surface of a substrate between trenches. The diode body is provided on the insulation layer on the surface of the substrate. The connection portions respectively extend downwards into respective trenches from one end of the
(Continued)

diode body. A dielectric layer is provided on the diode, and a metal conductor layer is provided on the dielectric layer.

10 Claims, 1 Drawing Sheet

(51) Int. Cl.
*H01L 29/78* (2006.01)
*H01L 29/866* (2006.01)

(56) References Cited

U.S. PATENT DOCUMENTS

| | | | |
|---|---|---|---|
| 9,620,615 | B2 | 4/2017 | Deng et al. |
| 9,673,193 | B2 | 6/2017 | Zhang et al. |
| 9,862,595 | B2 | 1/2018 | Jing |
| 9,947,785 | B2 | 4/2018 | Han et al. |
| 9,952,609 | B2 | 4/2018 | Zhang et al. |
| 9,953,970 | B2 | 4/2018 | Zhang et al. |
| 9,954,074 | B2 | 4/2018 | Zhong et al. |
| 9,975,766 | B2 | 5/2018 | Hu et al. |
| 9,977,342 | B2 | 5/2018 | Yao |
| 10,014,392 | B2 | 7/2018 | Qi et al. |
| 10,101,225 | B2 | 10/2018 | Qian |
| 2011/0266593 | A1* | 11/2011 | Hsieh ............... H01L 27/0255 257/139 |
| 2012/0049320 | A1* | 3/2012 | Parsey, Jr. ......... H01L 21/76898 257/528 |
| 2016/0233216 | A1 | 8/2016 | Zhang et al. |
| 2017/0011144 | A1 | 1/2017 | Hu et al. |
| 2017/0011957 | A1 | 1/2017 | Wang et al. |
| 2017/0205470 | A1 | 7/2017 | Li et al. |
| 2018/0130877 | A1 | 5/2018 | Huang et al. |
| 2018/0139544 | A1 | 5/2018 | Hu |
| 2018/0252996 | A1 | 9/2018 | Wan et al. |
| 2018/0342609 | A1 | 11/2018 | Qi et al. |
| 2018/0358390 | A1 | 12/2018 | Liu et al. |

FOREIGN PATENT DOCUMENTS

| | | |
|---|---|---|
| CN | 102097433 A | 6/2011 |
| CN | 104218099 A | 12/2014 |

OTHER PUBLICATIONS

International Search Report and English Translation thereof for International Application No. PCT/CN2016/096042, dated Nov. 18, 2016 (5 pages).

* cited by examiner

SEMICONDUCTOR DEVICE HAVING ELECTROSTATIC DISCHARGE PROTECTION STRUCTURE WITH A TRENCH UNDER A CONNECTING PORTION OF A DIODE

TECHNICAL FIELD

The present disclosure relates to a field of semiconductor manufacture technology, and more particularly relates to a semiconductor device having an electrostatic discharge (ESD) protection structure.

BACKGROUND

The ESD protection structure of a mainstream double diffused metal oxide semiconductor field effect transistor (DMOSFET) device having the ESD protection is achieved by manufacturing a diode on the polysilicon, the structure of which is shown in FIG. 1, and the diode is disposed in parallel between a source and a gate of the device. In order to electrically insulate the diode from other cell circuits, an insulating layer having a certain thickness should be made under the diode on the wafer during fabrication as required, therefore the area is higher than the other tube core areas. As semiconductor processes entering into a smaller linewidth era, the dielectric process of which has also developed into the relatively advanced chemical mechanical polishing (CMP) process. However, there are problems that a thicker dielectric thickness has to be set while performing the CMP process to ensure the process margin for the subsequent process due to high steps in part of areas, thereby sacrificing part of the performances of the tube core and causing the instability of the process itself, simultaneously.

SUMMARY

Accordingly, it is necessary to provide a semiconductor device having an ESD protection structure, which can address the problem that the conventional process needs to deposit a thicker dielectric layer to perform CMP.

A semiconductor device having the ESD protection structure is provided. The ESD protection structure is a diode coupled between a gate and a source of the semiconductor device. The diode includes a diode body and two connecting portions coupled to both ends of the diode body. The two connecting portions are configured to be electrically coupled to the gate and the source, respectively. Two trenches are provided under each of the two connecting portions, respectively. An insulating layer is provided on an inner surface of two trenches and a surface of the substrate between the two trenches. The diode body is located on the insulating layer on the surface of the substrate. The two connecting portions extend downwardly from one end of the diode body into the corresponding trenches, respectively. A dielectric layer is provided on the diode. A metal wire layer is provided on the dielectric layer. The metal wire layer includes a first metal leading-out electrically coupled to the gate and a second metal leading-out electrically coupled to the source. The first metal leading-out and the second metal leading-out are respectively coupled to one connecting portion through a contact hole penetrating through the dielectric layer.

According to the aforementioned semiconductor device having the ESD protection structure, the trench is provided under the connecting portions, and the connecting portions extend downwardly into the trench to have a thicker thickness and provide a vertical contact with the trench. Therefore the connecting portions can be directly used as an etch stop layer of the contact hole without adopting thicker field oxide layer as the insulating layer. Therefore it does not cause high steps, and the dielectric layer can also use a normal thickness to avoid wastage of the deposited thickness of the dielectric layer. Simultaneously, it also ensures compatibility with common CMP processes and facilitates the online process control.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

The present disclosure will be described in details with reference to the accompanying drawings and embodiments such that the purpose, technical solution and advantages of the present disclosure will be more apparent. The various embodiments of the invention may, however, be embodied in many different forms and should not be construed as limited to the embodiments set forth herein. Rather, these embodiments are provided so that this disclosure will be thorough and complete, and will fully convey the scope of the present disclosure to those skilled in the art.

Unless otherwise defined, all terms (including technical and scientific terms) used herein have the same meaning as commonly understood by one of ordinary skill in the art to which this invention belongs. The terminology used herein is for the purpose of describing particular embodiments only and is not intended to be limiting of the invention. It will be further understood that the term "and/or" is understood to encompass various alternative orientations.

Figure 1:
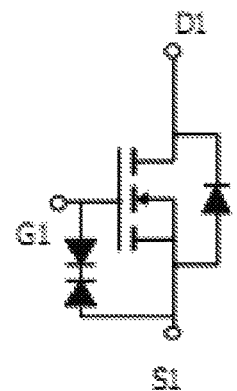
FIG. 1 is a circuit diagram of a semiconductor device having an ESD protection structure.
Figure 2:
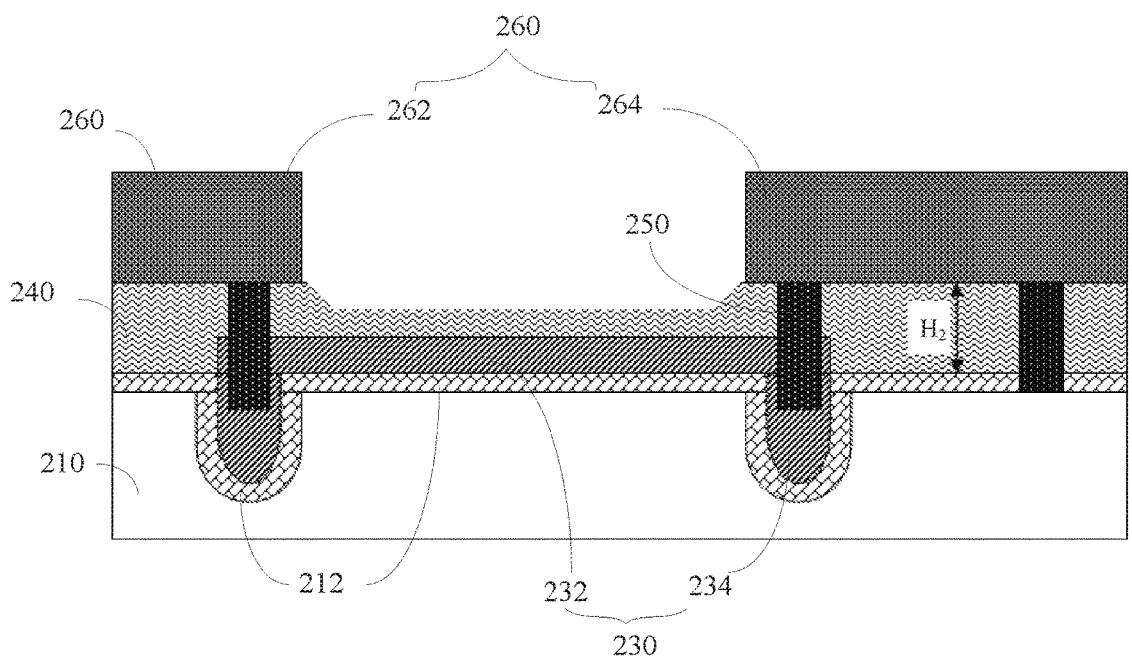
FIG. 2 is a cross-sectional view of a semiconductor device having an ESD protection structure according to an embodiment.

FIG. 2 is a cross-sectional view of a semiconductor device having an ESD protection structure according to an embodiment. As the ESD protection structure, a diode 230 includes a diode body 232 and two connecting portions 234 coupled to both ends of the diode body 232. The two connecting portions 234 are used to be electrically coupled to a gate (not shown in FIG. 2) and a source (not shown in FIG. 2), respectively. In the illustrated embodiment, the diode 230 is made of polysilicon. N-type and P-type impurities are doped into the diode body 232 to form a PN junction. In alternative embodiments, the diode 230 can also be made of other materials known in the art which are suitable for manufacturing the diode. A trench is provided under each of the two connecting portions 234. An insulating layer 212 is provided on an inner surface of two trenches and a surface of the substrate 210 between the two trenches. The diode body 232 is located on the insulating layer 212 on the surface of the substrate 210. The two connecting portions 234 extend downwardly from one end of the diode body 232 into the corresponding trenches, respectively. A dielectric layer 240 is provided on the diode 230. A metal wire layer 260 is provided on the dielectric layer 240. The metal wire layer 260 includes a first metal leading-out 262 electrically coupled to the gate and a second metal leading-out 264 electrically coupled to the source. The first metal leading-out 262 and the second metal leading-out 264 are respectively coupled to one connecting portion 234 through a contact hole 250 (the contact hole 250 is filled with conductive substances, usually metal) penetrating through the dielectric layer 240. The connecting portion 234 has a thicker thickness since it extend downwardly into the corresponding trench, thus it can be used as an etch stop layer for the contact hole 250 above it, which can prevent the contact hole 250 from being etched into insulating layer 212 due to process fluctuations.

According to the aforementioned semiconductor device having the ESD protection structure, the trench is provided under the contact hole 250 for connecting the diode 230, and the connecting portions 234 extend downwardly into the trench to have the thicker thickness and provide the vertical contact with the trench. In contrast to the conventional structure, the connecting portions 234 can be directly used as the etch stop layer of the contact hole 250, therefore it is not necessary to use the thicker field oxide layer as the insulating layer, and no high step will be produced. The dielectric layer 240 can also has a normal thickness to avoid wastage of the deposited thickness of the dielectric layer 240. Simultaneously, it also ensures compatibility with common CMP processes and facilitates the online process control. Since the thickness of the dielectric layer 240 is reduced, the depth of the contact hole penetrating through the dielectric layer 240 to connect to the substrate 210 is also reduced, thereby improving productivity while reducing costs.

The dielectric layer 240 can be an interlayer dielectric (ILD) layer, which is a multilayered structure formed by superimposing several types of a silicon dioxide layer deposited from tetraethyl orthosilicate (TEOS), a phosphosilicate glass (PSG)/boron-phosphorosilicate glass (BPSG) layer, a silicon oxynitride layer, and a silicon nitride layer.

According to an embodiment, the dielectric layer 240 should be subjected to CMP process, i.e., a dielectric layer with a thicker thickness is deposited firstly, and then part of the dielectric layer is polished by a planarization process of CMP to flat the surface of the device.

According to the aforementioned semiconductor device having the ESD protection structure, the thickness of the dielectric layer 240 is reduced by optimizing structure, which ensure that the CMP process can be compatible with a general CMP process, and facilitates the online process control. Comparing to the conventional structure, the production process costs can be significantly reduced and the difficulty of a single process can be reduced to improve productivity and yield, which is more suitable for the production process implementing CMP technology. In addition, comparing to the conventional flattening process, the CMP technology is more suitable for processing products with small line width, which is beneficial to improve integration level of the device and process yields.

According to the embodiment illustrated in FIG. 2, the insulating layer 212 is part of the gate oxide layer, i.e., when the gate oxide layer of the semiconductor device is formed, the silicon dioxide formed at the corresponding position is used as the insulating layer 212. The gate oxide layer is used as the insulating layer 212, which can save process and costs, and improve production efficiency. The thickness of the gate oxide layer is much less than that of the field oxide layer.

According to the embodiment illustrated in FIG. 2, the contact holes 250 are filled with tungsten serving as the conductive substance. In alternative embodiments, other materials known in the art, such as metals and alloys, which are suitable as conductive fillers of the contact hole, can also be used.

According to the embodiment illustrated in FIG. 2, the semiconductor device is a double diffused metal oxide semiconductor field effect transistor (DMOSFET).

According to the embodiment illustrated in FIG. 2, the dielectric layer 240 above the diode body 232 is depressed downwardly by over etching the metal wire layer 260, so as to ensure that there is no metal residue.

According to an embodiment, the diode 230 is a Zener diode. In alternative embodiments, other types of diodes may also be used for the diode 230.

Although the invention is illustrated and described herein with reference to specific embodiments, the invention is not intended to be limited to the details shown. It should be noted that any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. A semiconductor device having an electrostatic discharge (ESD) protection structure, wherein the ESD protection structure is a diode coupled to a first metal leading-out and a second metal leading-out of the semiconductor device, the diode comprises a diode body and two connecting portions coupled to both ends of the diode body, the two connecting portions are electrically coupled to the first metal leading-out and the second metal leading-out, respectively; a trench is provided under each of the two connecting portions; an insulating layer is provided on an inner surface of two trenches and a surface of a substrate between the two trenches; the diode body is located on the insulating layer on the surface of the substrate, the two connecting portions extend downwardly from one end of the diode body into the corresponding trenches, respectively, and a dielectric layer is provided on the diode.

2. The semiconductor device having the ESD protection structure of claim 1, wherein the semiconductor device comprises a gate oxide layer formed on the substrate, and wherein the insulating layer is part of the gate oxide layer.

3. The semiconductor device having the ESD protection structure of claim 1, wherein the dielectric layer is a dielectric layer subjected to a chemical mechanical polishing (CMP) process.

4. The semiconductor device having the ESD protection structure of claim 1, wherein the semiconductor device is a double diffused metal oxide semiconductor field effect transistor.

5. The semiconductor device having the ESD protection structure of claim 1, wherein the diode is made of polysilicon, and the diode body is doped with N-type impurities and P-type impurities.

6. The semiconductor device having the ESD protection structure of claim 1, wherein the dielectric layer is an interlayer dielectric (ILD) layer.

7. The semiconductor device having the ESD protection structure of claim 1, wherein a metal wire layer is provided on the dielectric layer, the metal wire layer comprises the first metal leading-out and the second metal leading-out, and the first metal leading-out and the second metal leading-out are respectively coupled to one connecting portion through a contact hole penetrating through the dielectric layer.

8. The semiconductor device having the ESD protection structure of claim 7, wherein the two contact holes are filled with tungsten serving as a conductive sub stance.

9. The semiconductor device having the ESD protection structure of claim 1, wherein the two connecting portions have a thickness that is greater than the diode body.

10. A semiconductor device having an electrostatic discharge (ESD) protection structure, wherein the ESD protection structure is a diode coupled to a first metal leading-out and a second metal leading-out, the diode comprises a diode body and two connecting portions coupled to both ends of the diode body, the two connecting portions are electrically coupled to the first metal leading-out and the second metal leading-out, respectively; a trench is provided under each of the two connecting portions; an insulating layer is provided on an inner surface of two trenches and a surface of a substrate between the two trenches; the diode body is located on the insulating layer on the surface of the substrate, the two connecting portions extend downwardly from one end of the diode body into the corresponding trenches, respectively, and a dielectric layer is provided on the diode, wherein a surface of the dielectric layer above the diode body is depressed downwardly.

* * * * *